United States Patent
Sinha et al.

(10) Patent No.: US 12,494,374 B2
(45) Date of Patent: Dec. 9, 2025

(54) METHODS FOR GAS PHASE SELECTIVE ETCHING OF SILICON-GERMANIUM LAYERS

(71) Applicants: PRAXAIR TECHNOLOGY INC., Danbury, CT (US); LINDE GMBH, Pullach, DE (US)

(72) Inventors: Ashwini K. Sinha, East Amherst, NY (US); Ce Ma, Apex, NC (US); Aaron Reinicker, Cary, NC (US); Atul M. Athalye, San Marcos, CA (US)

(73) Assignee: Praxair Technology, Inc., Danbury, CT (US)

( * ) Notice: Subject to any disclaimer, the term of this patent is extended or adjusted under 35 U.S.C. 154(b) by 493 days.

(21) Appl. No.: 17/793,816

(22) PCT Filed: Apr. 7, 2021

(86) PCT No.: PCT/US2021/026161
§ 371 (c)(1),
(2) Date: Jul. 19, 2022

(87) PCT Pub. No.: WO2021/216283
PCT Pub. Date: Oct. 28, 2021

(65) Prior Publication Data
US 2023/0044406 A1    Feb. 9, 2023

Related U.S. Application Data

(60) Provisional application No. 63/013,078, filed on Apr. 21, 2020.

(51) Int. Cl.
*H01L 21/308*        (2006.01)

(52) U.S. Cl.
CPC ...... *H01L 21/3081* (2013.01); *H01L 21/3086* (2013.01)

(58) Field of Classification Search
None
See application file for complete search history.

(56) References Cited

U.S. PATENT DOCUMENTS

| | | |
|---|---|---|
| 2007/0010851 A1 | 1/2007 | Chanduszko et al. |
| 2015/0099368 A1* | 4/2015 | Shen .......... H01J 37/32192 438/718 |

(Continued)

FOREIGN PATENT DOCUMENTS

| | | |
|---|---|---|
| CN | 103426764 A | 12/2013 |
| JP | 2004207695 A | 7/2004 |

(Continued)

OTHER PUBLICATIONS

E. Joseph Nemanick, et al., "Chemical and Electrical Passivation of Silicon (111) Surfaces through Functionalization with Sterically Hindered Alkyl Groups", J. Phys. Chem. B 2006, 110, 14800-14808.

(Continued)

*Primary Examiner* — Binh X Tran

(57) ABSTRACT

Methods for selectively etching SiGe relative to Si are provided. Some of the methods incorporate formation of a passivation layer on a surface of the Si layer to enhance SiGe etchant selectivity and the use of interhalogen gases that preferentially etch the SiGe as opposed to the Si in the presence of the passivation layer. The methods can occur in a cyclic manner until the desired thickness of the SiGe layer is obtained.

22 Claims, 2 Drawing Sheets

(56) References Cited

U.S. PATENT DOCUMENTS

| | | |
|---|---|---|
| 2020/0010553 A1 | 1/2020 | Yamano |
| 2020/0027741 A1* | 1/2020 | Kal et al. |
| 2020/0098575 A1* | 3/2020 | Takahashi ........... H01L 21/0262 |
| 2021/0335626 A1* | 10/2021 | Xue ................. H01L 21/02603 |

FOREIGN PATENT DOCUMENTS

| | | |
|---|---|---|
| JP | 2011003797 A | 1/2011 |
| JP | 2016-143781 A | 8/2016 |
| JP | 2019129313 A | 8/2019 |
| JP | 2020-053448 A | 4/2020 |
| KR | 100481871 B1 | 4/2005 |
| KR | 20110084130 A | 7/2011 |
| KR | 20150041567 A | 4/2015 |
| KR | 20200035213 A | 4/2020 |
| WO | 2020072277 A1 | 4/2020 |

OTHER PUBLICATIONS

N. Loubet, et al., A Novel Dry Selective Etch of SiGe for the Enablement of High Performance Logic Stacked Gate-All-Around NanoSheet Devices, 2019 IEEE International Electron Devices Meeting (IEDM), 2019, pp. 11.4.1-11.4.4, doi: 10.1109/IEDM19573.2019.8993615.

\* cited by examiner

METHODS FOR GAS PHASE SELECTIVE ETCHING OF SILICON-GERMANIUM LAYERS

RELATED APPLICATIONS

This application claims the benefit of priority to International Application No. PCT/US2021/026161, filed on Apr. 7, 2021, which claimed the benefit of priority to U.S. Provisional Application Ser. No. 63/013,078, filed on Apr. 21, 2020, which are incorporated herein by reference in its entirety for all purposes.

FIELD OF INVENTION

This invention relates to selective etching of silicon-germanium layers on a wafer in connection with semiconductor fabrication. More particularly, the invention pertains to novel methods for improving the selectivity ratio of silicon-germanium layer relative to silicon during semiconductor fabrication that is not possible with conventional etchant techniques.

BACKGROUND OF THE INVENTION

Amorphous silicon (a-Si), polycrystalline silicon (poly-Si) and single crystal Si, in conjunction with silicon-germanium ("SiGe") are widely used in the semiconductor industry for different applications. For sub-20 nm technology nodes and below, the integration of SiGe as a source-drain material has shown potential to improve electrical performance for transistors. Various transistors can be formed on a substrate.

In scaling beyond 5 nm technology nodes, the semiconductor device industry is moving away from FinFet transistor structures towards so-called gate all-around (GAA) device architectures. One fundamental requirement for GAA implementation is the formation of SiGe and Si nanowires (NW) and Si nanosheets (NS). Specifically, horizontally-stacked silicon nanowires (HNW), and horizontally stacked nanosheets (HNS) are being investigated. HNS has been identified as the next generation device structure at 3 nm node and sub-3 nm nodes.

However, in order to successfully manufacture FINS structures, advanced methodologies are required to address the challenges and meet the demands for aggressive patterning that continue to reduce the size of the critical features. The ability to successfully integrate patterning schemes with highly selective etch processes is critical to reliable pattern transfer. Pattern transfer can be carried out as follows. After the circuit pattern is formed, a protective layer (e.g., photosensitive material patterned using optical lithography, a mechanically imprinted patterned layer or a direct self-assembled layer) is used to mask certain regions of the semiconductor substrate, while other regions of the semiconductor substrate remain exposed. The remaining exposed regions allow the transfer of the circuit pattern onto an underlying layer of the substrate by utilizing a dry etching process. The ability to fabricate the FINS features requires high etch selectivity of SiGe to Si that is not currently available. The etch selectivity is defined as the ratio of etch rate for two different surfaces when exposed to an etchant process. For example, an etch selectivity of 100:1 for SiGe to Si under exposure to a certain etchant process means that the etch rate for SiGe surface is 100 times higher than a Si surface when using the etchant process.

Conventional etchant techniques such as direct plasma etch, plasma atomic layer etching (ALE), or ion milling are not capable of achieving the higher etch selectivity ratios of SiGe to Si required for creating HNS features. By way of example, for three stacked silicon NS's, there are four SiGe sacrificial layers. The removal of the SiGe sacrificial layers without Si NS damage is required and represents a critical process step in GAA HNS devices. The undercut or cavity SiGe etch requires high precision and high selectivity isotropic chemical etches not possible by conventional etch techniques.

Other traditional etchant methods involve oxidative wet etch methods that are commonly seen in selective etching of SiGe over Si in the micro-electromechanical systems (MEMS) industry and in early GAA HNS research. However, generally speaking, the semiconductor industry prefers not to utilize a wet-based etchant method. Instead, the industry desires a selective dry chemical etch for better Si FINS release quality and easier high-volume manufacturing processes.

Dry thermal etch processes are being created for the selective etching of SiGe over Si, $SiO_3$, SiC, and $Si_3N_4$. However, such dry thermal etchant processes remain deficient. Specifically, current methods, such as remote $CF_4/O_2$ based plasmas, are only capable of producing an etch selectivity of 50:1. In other words, the etch rate for SiGe surface is 50 times higher than a Si surface when using the CF4/O2 remote plasma process.

Currently, as other alternatives, thermal dry etching process using interhalogen species such as $ClF_3$, or different mixtures of $F_2$ and inert gases from early MEMS research activities has been investigated (U.S. Patent Publication No. 2020027741; and Loubet et al., *A Novel Dry Selective Etch of SiGe for the Enablement of High Performance Logic Stacked Gate-All-Around NanoSheet Devices*, IEDM, pp. 1-4, 2019). Etch selectivity of up to 150:1 for superlattice SiGe:Si layers have been reported when utilizing $ClF_3$ as an interhalogen etchant.

Despite current developmental activities, there remains a continued demand for higher etch selectivity to improve GAA nanostructure performance and increase manufacturing productivity. There is currently an unmet demand for etch selectivity of SiGe to Si, $SiO_2$, $Si_3N_4$ and SiC that is greater than 150:1.

SUMMARY OF THE INVENTION

In one aspect, a method of selectively dry etching a substrate, comprising the steps of: providing a substrate in an etch chamber, said substrate comprising a silicon-germanium alloy layer and a silicon layer; introducing a fluorine-containing interhalogen gas into the etch chamber; selectively etching a first portion of the silicon-germanium alloy layer that is subsequently removed from the etch chamber as a first portion of volatized fluorides of silicon and germanium; converting the silicon layer into a non-volatized fluorinated silicon layer; withdrawing any residual amount of the fluorine-containing interhalogen gas from the etch chamber; introducing a passivating gas into the etch chamber selectively convert the non-volatized fluorinated silicon layer into a passivating silicon layer, whereby the passivating gas does not substantially react with the silicon-germanium alloy layer; withdrawing any residual amount of the passivating gas from the etch chamber; re-introducing the fluorine-containing interhalogen gas into the etch chamber; and selectively etching a second portion of the silicon-germanium alloy layer that is subsequently removed from the etch chamber as a second portion of volatized fluorides of silicon and germanium without substantial etching of the passivating silicon layer.

In a second aspect, a method of selectively dry etching a substrate, comprising the steps of: providing a substrate in an etch chamber, said substrate comprising a silicon-germanium alloy layer and a silicon layer; introducing a first etchant gas into the etch chamber, wherein said first etchant gas comprises a fluorine-containing interhalogen gas; selectively etching a first portion of the silicon-germanium alloy layer that is subsequently removed from the etch chamber as a first portion of volatized fluorides of silicon and germanium; converting the silicon layer into a non-volatized fluorinated silicon layer; withdrawing any residual amount of the fluorine-containing interhalogen gas from the etch chamber; introducing a passivating gas into the etch chamber to selectively convert the non-volatized fluorinated silicon layer into a passivating silicon layer, whereby the passivating gas does not substantially react with the silicon-germanium alloy layer; withdrawing any residual amount of the passivating gas from the etch chamber; introducing a second etchant gas into the etch chamber; and selectively etching a second portion of the silicon-germanium alloy layer that is subsequently removed from the etch chamber as a second portion of volatized fluorides of silicon and germanium without substantial etching of the passivating silicon layer.

In a third aspect, a method of selectively dry etching a substrate, comprising the steps of: providing a substrate in an etch chamber, said substrate comprising a silicon-germanium alloy layer and a silicon layer, wherein said silicon-germanium alloy layer is in-situ doped with an n-type or p-type dopant; exposing the substrate to an etchant gas; and selectively removing a portion of the silicon-germanium alloy layer of silicon and germanium without substantial removal of the passivating silicon layer.

In a fourth aspect, a method of selectively dry etching a substrate, comprising the steps of: providing a substrate in an etch chamber, said substrate comprising a silicon-germanium alloy layer and a silicon layer; and selectively etching the silicon-germanium alloy layer with the use of an interhalogen fluorine-containing gas while creating and maintaining a passivating layer on the Si layer.

DETAILED DESCRIPTION OF THE INVENTION

Figure 1:
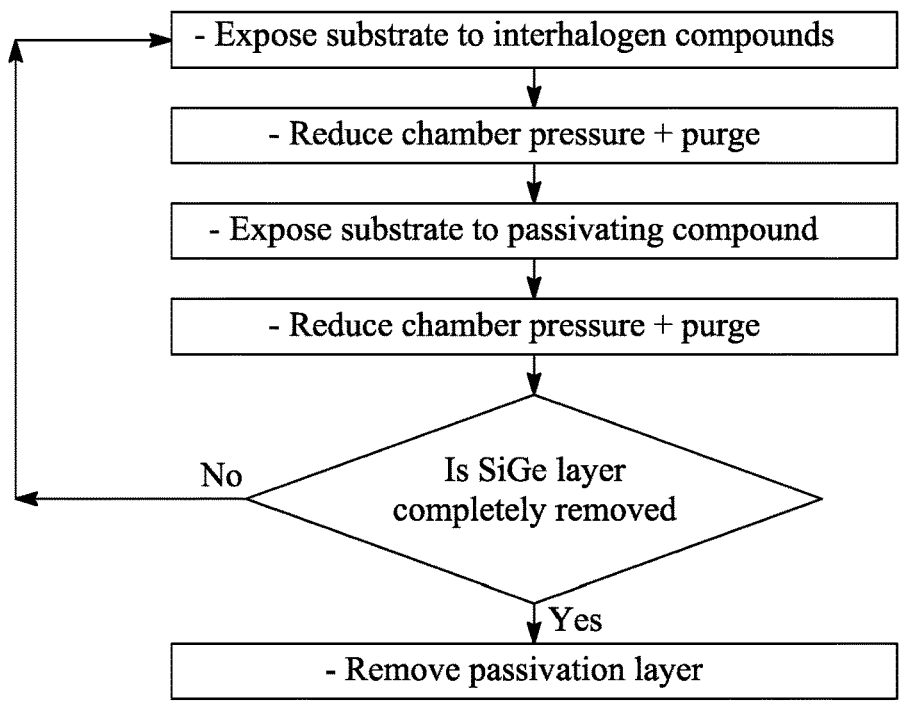
FIG. 1 illustrates a flow chart of an etchant process according to a first embodiment of the present invention.

As will be described, the present invention offers methods for performing selective dry etching of a substrate. SiGe can be preferentially etched relative to Si by using the methods of the present invention. The higher selectivity ratios of SiGe to Si of the present invention allows fabrication of GAA device architectures.

The terms "etch selectivity" or "selectivity" or "selectivity ratio", as used herein and throughout may be used interchangeably to mean the ratio of etch rate for two different surfaces when exposed to an etchant process, where etch rate is typically measured in units of nanometers per minute.

The term "layer" as used herein and throughout is intended to mean a continuous, semi-continuous or non-continuous deposition of a certain material along a substrate that may be composed of a single layer or one or more layers.

The term "interhalogen" as used herein and throughout is intended to mean a compound that is composed of two or more different halogen atoms.

Unless specified otherwise, all of the passivating compounds and etchants described herein and throughout are intended to be in the gas phase.

"SiGe" or "SiGe alloy" or "silicon-germanium alloy" as used herein and throughout may be used interchangeably to mean an alloy of silicon and germanium with varying compositional ratios of Si to Ge.

"Si" or "silicon" as used herein and throughout may be used interchangeably.

"Substrate" as used herein and throughout is intended to mean any portion of a semiconductor or other electronics device such as a semiconductor wafer, or one or more layers on or overlying a base substrate structure.

Where a range of values describes a parameter, all sub-ranges, point values and endpoints within that range or defining a range are explicitly disclosed therein. All physical property, dimension, and ratio ranges and sub-ranges (including endpoints) between range end points for those properties, dimensions, and ratios are considered explicitly disclosed herein.

The embodiments as described herein are intended to refer to epitaxial grown SiGe and Si structures. However, the present invention can be applicable to other growth modes.

The selective etching of SiGe to Si will be described hereinbelow for SiGe that can preferably have a composition of Si between 40 and 99 atomic percent with the balance Ge; or a SiGe composition of Ge between 1 and 60 atomic percent, with the balance Si; or a SiGe composition of Ge having a minimum Ge content of 15 atomic percent, with the balance Si.

The embodiments as described below are by way of example only, and the invention is not limited to the embodiments illustrated in the drawings. It should be understood that the drawings are not to scale and in certain instances details have been omitted, which are not necessary for an understanding of the embodiments, such as conventional details of fabrication and assembly. It should also be understood that the exact configurations of GAA device architectures, NW, NS, HNW HNS are not drawn to scale, and certain features are intentionally omitted in each of the drawings to better illustrate various aspects of the etchant processes in accordance with the principles of the present invention.

The embodiments are described with reference to the drawings in which similar elements are referred to by like numerals. The relationship and functioning of the various elements of the embodiments are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

In a first embodiment of the present invention, an improved dry etch process is provided for selectively etching SiGe relative to Si on a substrate. The etch process is conducted by exposing the Si and SiGe surfaces with different gas compositions in a sequential manner. The process can achieve an etch selectivity of greater than 150:1. FIG. 1 illustrate the process scheme. The etch process is conducted using the following steps, as will now be explained. A substrate is provided that is loaded into an etch chamber. The substrate comprises one or more layers of SiGe and Si. The substrate is maintained at a temperature in the range from −60° C. to +150° C. The etch process is preferentially conducted at a chamber pressure in the range of about 1 mTorr to about 10 torr.

Next, a fluorine-containing interhalogen gas is introduced into the etch chamber (step 1 of FIG. 1). The fluorine-containing interhalogen gas, by way of example and not intended to be limiting, can include ClF3, ClF5, BrF3, BrF5, IF5 and IF7, or any combination thereof. Other gases can be introduced with the fluorine-containing interhalogen gas. The flow rate of the fluorine-containing interhalogen gas and any other gases introduced therewith can each range from 10 sccm to 2000 sccm.

The substrate is exposed to the fluorine-containing interhalogen gas. Specifically, the fluorine-containing interhalogen reacts with the silicon and silicon-germanium alloy layer to form a fluoride terminated-layer. The pressure in the chamber is subsequently reduced (step 2 of FIG. 1) to enable desorption of the layer of the fluorides of Si and Ge. The exposed portion of the Si and SiGe takes the form of volatized fluorides of Si and Ge. An inert gas is introduced into the etch chamber to purge the etch chamber of the desorbed fluorides of Si and Ge.

Figure 2:
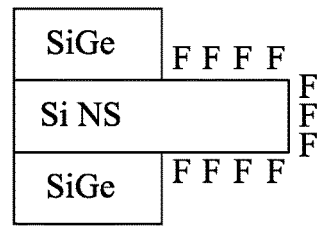
FIG. 2 illustrates a representative resultant surface after etching a first portion of a SiGe alloy layer with a fluorine-containing interhalogen gas, and exposing the fluorine-containing interhalogen gas to a Si surface to form a fluorine terminated layer on the Si surface, in accordance with one of the steps of the etchant process of FIG. 1 and FIG. 4.

In addition to selectively etching a first portion of SiGe, the fluorine-containing interhalogen gas also causes the silicon layer to be converted into a non-volatized fluorinated silicon layer. Specifically, a fluorine terminated layer is produced on the surface of the Si layer as shown in FIG. 2. Any remaining residual fluorine-containing interhalogen gas in the etch chamber can be withdrawn. The resultant surface after exposure of the substrate to the fluorine-containing interhalogen gas is shown in FIG. 2.

Figure 3:
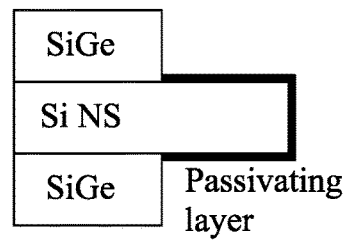
FIG. 3 illustrates a representative passivating Si layer which selectively forms on the Si surface, and not the SiGe surface, in accordance with one of the steps of the etchant process of FIG. 1 and FIG. 4.

Next, step 3 of FIG. 1 can be performed, whereby the resultant fluorinated Si surface as shown in FIG. 2 is exposed to a passivating gas that comes into contact with the non-volatized fluorinated layer of the Si. The passivating gas reacts with the non-volatized fluorinated layer of the Si to convert it into a passivating silicon layer. The passivating Si layer is only produced on the Si layer, and not the SiGe layer. The resultant passivating layer on the Si is shown in FIG. 3.

Different passivating gases include, but are not limited to $NH_3$, $H_2O$, $O_2$, compounds with an alcohol functional group, $H_2S$, $H_2Se$ or any combination thereof. The passivating layer can be a layer of silicon oxide, silicon sulfide, silicon nitride, or silicon selenide or any mixture thereof. The passivating layer may also contain additional carbon or hydrogen on the surface as a self-assembled monomer or alkyl chain. The passivating layer may also include a fluorosilicate salt such as $(NH_4)_2SiF_6$.

After formation the passivating layer, Step 4 of FIG. 1 can be performed, whereby the pressure in the etch chamber is reduced below the pressure in step 3 and the chamber is purged or pumped down to remove any residual passivating compound from the etchant chamber.

Having created the Si-passivating layer, and with a first portion of the SiGe removed, the fluorine-containing interhalogen gas utilized in step 1 of FIG. 1 can be re-introduced into the etch chamber. The fluorine-containing gas selectively etches a second portion of the silicon-germanium alloy layer that is subsequently removed from the etch chamber without substantial etching of the passivating silicon layer. The second portion is etched to release volatized fluorides of silicon and germanium from the SiGe layer.

Step 1, Step 2, Step 3 and Step 4 of FIG. 1 is performed sequentially and in a cyclic manner until the SiGe layer has been etched to a predetermined amount (e.g., a desired distance or a desired thickness). Alternatively, the entire SiGe layer may be fully removed.

Upon determining in Step 5 of FIG. 1 that the predetermined amount of SiGe has been etched, a final step 6 is performed to remove the passivation layer from the Si surface. The resultant product is the horizontally stacked Si nanosheets (HNS).

During the etch process described hereinabove, the passivating gas is re-introduced at step 3 during cyclic operation of steps 1-4, as may be needed to re-establish the passivating silicon layer prior to performing selective etching of the SiGe with the fluorine-containing interhalogen gas. However, it will be appreciated that the present invention can be carried out by eliminating the re-introduction of the passivating gas. Scenarios for eliminating the re-introduction of the passivating gas can include by way of example, determining that a substantial portion of the initially formed passivating layer has remained in-tact on the surface of the silicon layer; or determining that a sufficient amount of the passivating layer remains after performing multiple selective etchings of SiGe such that the selectivity ratio of SiGe to Si remains adequately high to perform one or more additional SiGe etchings.

Figure 4:
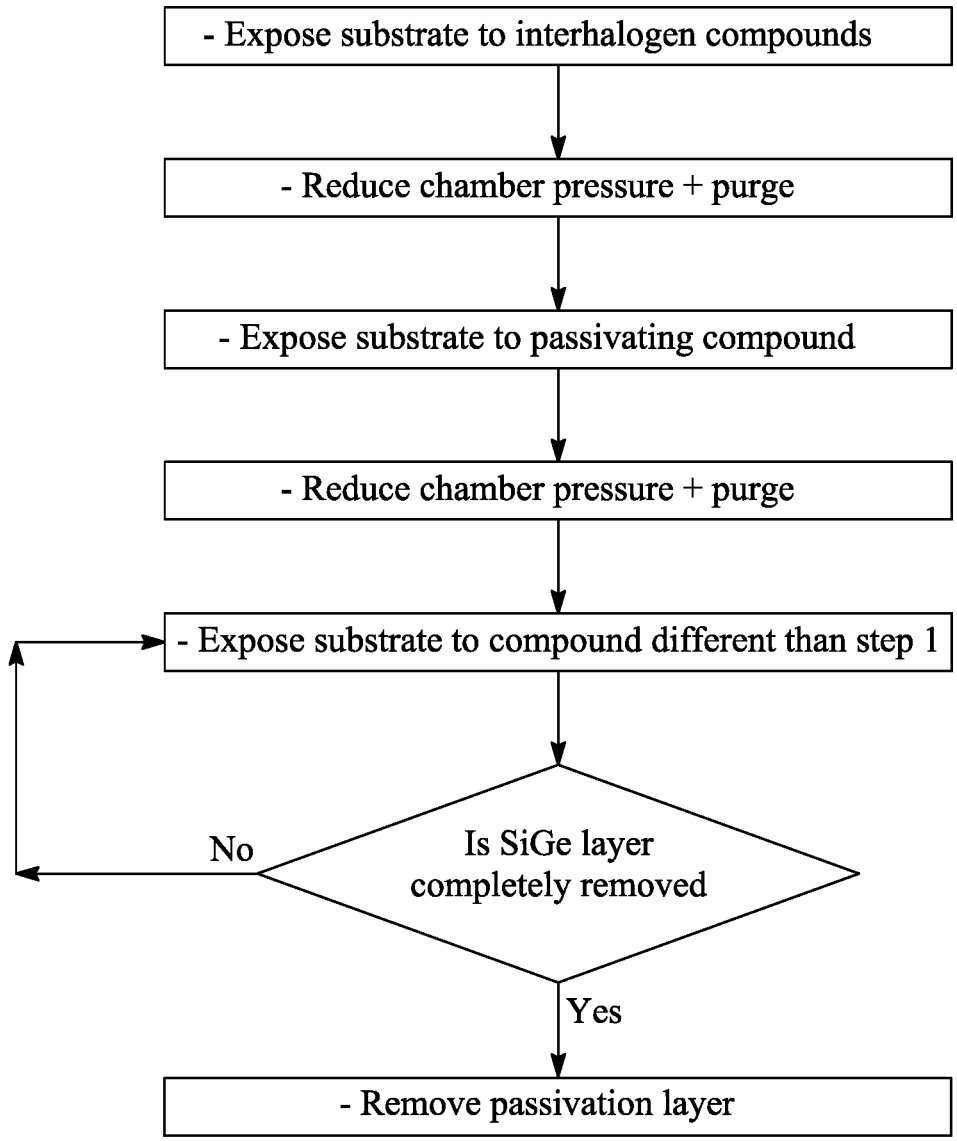
FIG. 4 illustrates a flow chart of an etchant process according to a second embodiment of the present invention.

In a second embodiment of the present invention, an improved dry etch process is provided for selectively etching SiGe to Si on a substrate. The etch process is conducted by exposing the Si and SiGe surfaces with different gas compositions in a sequential manner. The process can achieve an etch selectivity of greater than 150:1. FIG. 4 illustrates the process scheme. Steps 1, 2, 3 and 4 of FIG. 4 are identical to those of FIG. 1. Accordingly, the discussion of Steps 1, 2, 3 and 4 with reference to the first embodiment and FIGS. 2 and 3 are hereby incorporated by reference.

However, unlike the flow scheme shown in FIG. 1, the flow scheme of FIG. 4 includes a different Step 5, which involves subjecting SiGe and the passivated Si layer to a second etchant gas that has a different chemistry than the fluorine-containing interhalogen gas introduced in Step 1. A second etchant gas is introduced into the etch chamber to react with the silicon-germanium alloy layer. The second etchant gas etches a second portion of the silicon-germanium alloy layer that is subsequently removed from the etch chamber as a second portion of volatized fluorides of silicon and germanium without substantial etching of the passivating silicon layer. Examples of alternate etch chemistries that can used in Step 5 comprises fluorocarbon and hydrofluorocarbon compounds such as CF4, C4F8, C4F6, CH3F or fluorinated compounds such as F2, XeF2, NF3 or any mixture of the foregoing. The second etchant gas is selected to ensure that preferential etching of SiGe over the passivating Si layer so as to achieve an etch selectivity of greater than 150:1. The second etchant gas is chosen with an intent to achieve a higher etch selectivity compared to the etch selectivity offered from the etch chemistry used in step 1. Step 5 is performed in a cyclic manner until the SiGe layer has been etched to a predetermined amount (e.g., a desired distance or a desired thickness). Alternatively, the entire SiGe layer may be fully removed.

Upon determining in Step 5 of FIG. 1 that the predetermined amount of SiGe has been etched or the entire SiGe layer has been removed, a final Step 6 is performed to remove the passivation layer from the Si surface. The resultant product is the horizontally stacked Si nanosheets (HNS).

The process of FIG. 4 also contemplates re-introducing passivating gas one or more times as may be needed to re-establish the passivating layer on the surface of the Si layer, thereby improving the etch selectivity of SiGe to Si to greater than 150:1. Alternatively, or in addition thereto, prior to achieving the predetermined amount of etching of SiGe, the process of FIG. 4 also contemplates repeating any or all of Steps 1-4 if desired.

Other aspects of the present invention are contemplated which do not rely on formation of a passivation layer. For example, during formation of the SiGe layer on the substrate, the SiGe layer can be in-situ doped with either an n-type or p-type dopant. Both surfaces of the SiGe and Si are then etched with either a fluorinated or interhalogen compound. The dopant that is previously implanted in the SiGe can increase the etching selectivity of SiGe to Si greater than 150:1. The gas species for producing the n-type or p-type dopant may be any compound containing atoms from group 13 or 15 of the periodic table, and may include, but are not limited to, $BF_3$, $NF_3$, $NH_3$, $PH_3$, $AsH_3$, $PF_3$, $PF_5$, $AsF_3$, $AsF_5$, $B_2H_6$, $SbF_5$, dimethyl aluminum chloride, trimethyl gallium, trimethyl aluminum, $AlCl_3$, $AlI_3$, $GaCl_3$, $GaI_3$, $SbF_3$, $Sb_2O_3$, and trimethyl antimony. The range of temperature, pressure and flow rates are those disclosed hereinabove with respect to the other embodiments.

In another example, the selective etchant process involves introducing an interhalogen gas and one or more additional gas species into the etchant chamber so as to contact the SiGe and Si surfaces, and increase the selectivity etch of SiGe compared to Si to greater than 150:1. The range of temperature, pressure and flow rates are those disclosed hereinabove with respect to the other embodiments. The one or more additional gas species can be either a rate inhibitor or a rate enhancer species or a combination of any thereof. A rate inhibitor species reduces the rate of etching on both the SiGe and Si surfaces, but the rate reduction on the Si surface is greater than the rate reduction on the SiGe surface, thereby having the overall effect of increasing the selectivity of etching on SiGe compared to Si. Conversely, a rate enhancer species increases the rate of etching on both surfaces, but the rate increase on the SiGe surface is greater than the rate increase on the Si surface, thereby having the overall effect of increasing the selectivity etching of SiGe compared to Si.

The different interhalogen gases include but are not limited to $ClF_3$, $ClF_5$, $BrF_3$, $BrF_5$, $IF_5$ and $IF_7$ or any mixture of the foregoing. Different rate inhibitor gas species include but are not limited to $Cl_2$, $Br_2$, $I_2$, $BCl_3$, $HCl$, $HBr$, $HI$, $NCl_3$ and $SF_6$ or any mixture of the foregoing. Different rate enhancer gas species include but are not limited to $F_2$, $HF$, $XeF_2$, $OF_2$, $COF_2$, $CF_4$ and $NF_3$ or any mixture of the foregoing.

The function of the rate inhibitor is to reduce the rate of etching on the Si surface by more than the rate of etching is reduced on the SiGe surface, at a given temperature and pressure. Achieving more reduction in the Si etch rate than the SiGe etch rate can be done by introducing a species containing a halogen such as Cl, Br, or I that is less reactive to Si etching than fluorine. Without being bound by any theory, the halogen-containing species remains adsorbed on the Si surface and blocks sites for the adsorption of F atoms. The effect can be more pronounced on a Si surface compared to SiGe, since there are fewer empty Si sites available for adsorption compared to SiGe due to the higher desorption rate of GeFx.

The function of the rate enhancer species is to increase the rate of SiGe etching by more than the rate of etching is increased for Si, at a given temperature and pressure. Without being bound by any theory, the inter-lattice spacing of Si—Ge compared to Si—Si allows for $GeF_x$ to desorb more easily from the SiGe surface compared to $SiF_x$ desorption, thereby making available a higher number of empty sites for F atoms to adsorb onto the surface and combine with surface Si—F species to form $SiF_x$, which can then desorb from the surface. The rate limiting step in the etching process of the interhalogen species on Si may be the desorption of the $SiF_x$ product.

For all of the embodiments disclosed, certain etch gases, and accompanying co-flow gases can be stored and delivered from a premixed storage container. Similarly, certain etch gas mixtures can stored and delivered from a premixed storage container. Alternatively, each of the etchant gases can be stored in separate storage containers, and then flowed into the etch chamber at the desired ratio via a separate flow manifold to create the resultant mixture upstream or within the etchant chamber. In addition, external heat may be applied to one or more of the storage containers to generate a sufficient driving force for delivery of the etch gases from one or more of the storage containers to the etch chamber. Furthermore, a carrier gas can be bubbled through the storage container to carry the etchant gas to enable delivery to the etch chamber.

While all of the embodiments disclose methods for selective etching of SiGe to Si, the principles of the present invention can also be applied to the selective etching of SiGe over various other semiconductor compounds including but not limited to Si, $SiO_2$, SiC, $Si_3N_4$ or Si alloyed with other elements besides Ge.

While it has been shown and described what is considered to be certain embodiments of the invention, it will, of course, be understood that various modifications and changes in form or detail can readily be made without departing from the spirit and scope of the invention. It is, therefore, intended that this invention is not limited to the exact form and detail herein shown and described, nor to anything less than the whole of the invention herein disclosed and hereinafter claimed.

The invention claimed is:

1. A method of selectively dry etching a substrate, comprising the steps of:
   providing a substrate in an etch chamber, said substrate comprising a silicon-germanium alloy layer and a silicon layer;
   introducing a fluorine-containing interhalogen gas into the etch chamber;
   selectively etching a first portion of the silicon-germanium alloy layer that is subsequently removed from the etch chamber as a first portion of volatized fluorides of silicon and germanium;
   converting the silicon layer into a non-volatized fluorinated silicon layer;
   withdrawing any residual amount of the fluorine-containing interhalogen gas from the etch chamber;

introducing a passivating gas into the etch chamber to selectively convert the non-volatized fluorinated silicon layer into a passivating silicon layer, whereby the passivating gas does not substantially react with the silicon-germanium alloy layer, wherein the passivating gas is introduced after introducing the fluorine-containing interhalogen gas;

withdrawing any residual amount of the passivating gas from the etch chamber;

re-introducing the fluorine-containing interhalogen gas into the etch chamber; and selectively etching a second portion of the silicon-germanium alloy layer that is subsequently removed from the etch chamber as a second portion of volatized fluorides of silicon and germanium without substantial etching of the passivating silicon layer.

2. The method of claim 1, wherein the passivating gas is selected from the group consisting of $NH_3$, $H_2O$, $O_2$, compounds with an alcohol functional group, $H_2S$, $H_2Se$ and any combination thereof.

3. The method of claim 1, wherein the passivating silicon layer is selected from the group consisting of silicon oxide, silicon sulfide, silicon nitride, silicon selenide and a fluorosilicate salt.

4. The method of claim 1, wherein the passivating silicon layer comprises incorporation of carbon or hydrogen as a self-assembled monomer or alkyl chain.

5. The method of claim 1, further comprising withdrawing the residual amount of the fluorine-containing interhalogen gas after converting the silicon layer into the non-volatized fluorinated silicon layer, and prior to introducing the passivating gas into the etch chamber.

6. The method of claim 1, wherein the step of withdrawing the residual amount of the passivating gas occurs after converting the non-volatized fluorinated silicon layer into the passivating silicon layer and prior to re-introducing the fluorine-containing interhalogen gas into the etch chamber.

7. The method of claim 1, further comprising repeating the step of re-introducing the fluorine-containing interhalogen gas into the etch chamber one or more times to further react with the silicon-germanium alloy layer until a predetermined amount of the silicon-germanium alloy layer is selectively etched and subsequently removed from the etch chamber without substantial etching of the passivating silicon layer.

8. The method of claim 7, further comprising the steps of:
removing the passivating silicon layer to expose the silicon layer when the predetermined amount of the silicon-germanium alloy layer has been selectively etched and subsequently removed from the etch chamber.

9. The method of claim 7, further comprising re-introducing the passivating gas into the etch chamber to re-establish the passivating silicon layer prior to the step of repeating the re-introducing of the fluorine-containing interhalogen gas into the etch chamber one or more times.

10. A method of selectively dry etching a substrate, comprising the steps of:
providing a substrate in an etch chamber, said substrate comprising a silicon-germanium alloy layer and a silicon layer;
introducing a first etchant gas into the etch chamber, wherein said first etchant gas comprises a fluorine-containing interhalogen gas;
selectively etching a first portion of the silicon-germanium alloy layer that is subsequently removed from the etch chamber as a first portion of volatized fluorides of silicon and germanium;
converting the silicon layer into a non-volatized fluorinated silicon layer;
withdrawing any residual amount of the fluorine-containing interhalogen gas from the etch chamber;
introducing a passivating gas into the etch chamber to selectively convert the non-volatized fluorinated silicon layer into a passivating silicon layer, whereby the passivating gas does not substantially react with the silicon-germanium alloy layer, and wherein the passivating gas is introduced after introducing the fluorine-containing interhalogen gas;
withdrawing any residual amount of the passivating gas from the etch chamber;
introducing a second etchant gas into the etch chamber; and
selectively etching a second portion of the silicon-germanium alloy layer that is subsequently removed from the etch chamber as a second portion of volatized fluorides of silicon and germanium without substantial etching of the passivating silicon layer.

11. The method of claim 10, wherein the second etchant gas is selected from the group consisting of CF4, C4F8, C4F6, CH3F, F2, XeF2, NF3 and any combination thereof.

12. The method of claim 10, further comprising withdrawing the residual amount of the fluorine-containing interhalogen gas after converting the silicon layer into the non-volatized fluorinated silicon layer and prior to introducing the passivating gas into the etch chamber.

13. The method of claim 10, further comprising withdrawing the residual amount of the passivating gas after converting the non-volatized fluorinated silicon layer into the passivating silicon layer and prior to introducing the second etchant gas into the etch chamber.

14. The method of claim 10, further comprising the step of re-introducing an additional amount of the second etchant gas into the etch chamber to further react with the silicon-germanium alloy layer until a predetermined amount of the silicon-germanium alloy layer is selectively etched without substantial etching of the passivating silicon layer.

15. The method of claim 14, further comprising the step of:
removing the passivating silicon layer when the predetermined amount of the silicon-germanium alloy layer is selectively etched and subsequently removed from the etch chamber.

16. The method of claim 14, further comprising re-introducing the passivating gas into the etch chamber to re-establish the passivating silicon layer prior to the step of re-introducing the additional amount of the second etchant gas into the etch chamber.

17. A method of selectively dry etching a substrate, comprising the steps of:
providing a substrate in an etch chamber, said substrate comprising a silicon-germanium alloy layer and a silicon layer; and
selectively etching the silicon-germanium alloy layer with the use of an interhalogen fluorine-containing gas to form a fluoride terminated-layer on the silicon layer, while creating and maintaining a passivating layer on the Si layer.

18. The method of claim 17, further comprising introducing an additional gas species into the etch chamber, said additional gas species comprising a rate inhibitor species to reduce a rate of etching on the Si layer more than that of the silicon-germanium alloy layer.

19. The method of claim 17, further comprising introducing an additional gas species into the etch chamber, said additional gas species comprising a rate enhancer species to increase a rate of etching on the silicon-germanium alloy layer more than that of the Si layer.

20. The method of claim 17, further comprising introducing additional gas species into the etch chamber, said additional gas species comprising a rate inhibitor species and a rate enhancer species.

21. The method of claim 17, wherein the passivating layer is formed by flowing a passivating gas into the etch chamber towards an exposed surface of the silicon layer.

22. The method of claim 21, wherein the passivating gas is flowed into the etch chamber after etching a first portion of the silicon-germanium alloy layer with the interhalogen fluorine-containing gas, thereby exposing at least a portion of the silicon layer.

\* \* \* \* \*